United States Patent [19]

Moon

[11] 4,380,827
[45] Apr. 19, 1983

[54] OSCILLATOR FOR TELEVISION TUNER
[75] Inventor: Frederick H. Moon, Mt. Prospect, Ill.
[73] Assignee: Zenith Radio Corporation, Glenview, Ill.
[21] Appl. No.: 304,391
[22] Filed: Sep. 21, 1981
[51] Int. Cl.³ .............................................. H04B 1/26
[52] U.S. Cl. .................................. 455/179; 331/109; 334/15; 455/195; 455/318
[58] Field of Search .................. 331/109, 182, 177 V; 455/179, 195, 196, 318; 334/15

[56] References Cited
U.S. PATENT DOCUMENTS 3,356,952 12/1967 Sev ........................................ 455/196
3,723,906 3/1973 Pedersen .............................. 331/109
3,813,615 5/1974 Okazaki ............................... 455/196
3,889,210 6/1975 Matsuura et al. ................... 455/196
4,160,213 7/1979 Carter .................................. 455/180

Primary Examiner—Marc E. Bookbinder

[57] ABSTRACT

An oscillator is described for use in the tuner of a television receiver which is tuned to a selected channel by a variable tuning voltage. The oscillator provides a higher than conventional power output at relatively low channel numbers by virtue of circuitry which changes the oscillator's operating current in response to the tuning voltage reaching a predetermined value. That predetermined value is selected to correspond to a relatively low channel number at which the power output of a conventional oscillator begins to decline.

5 Claims, 8 Drawing Figures

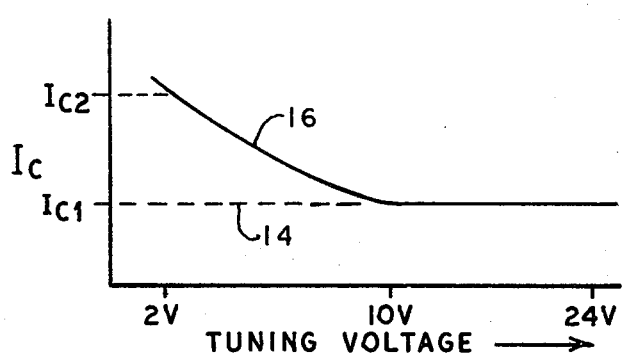
FIG. 3
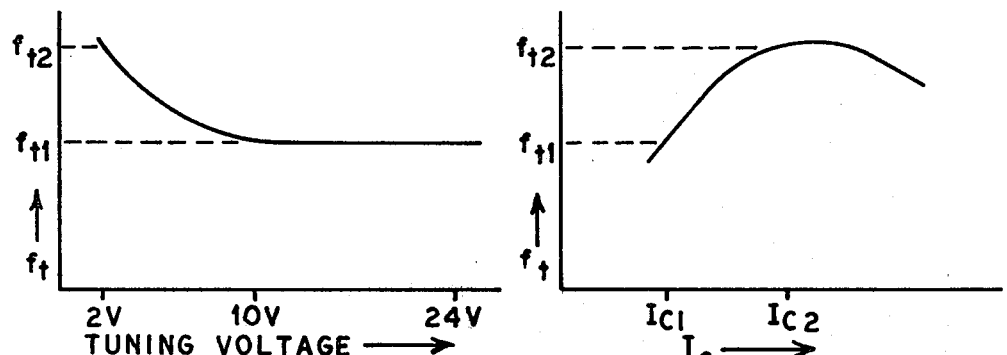
FIG. 5
FIG. 6
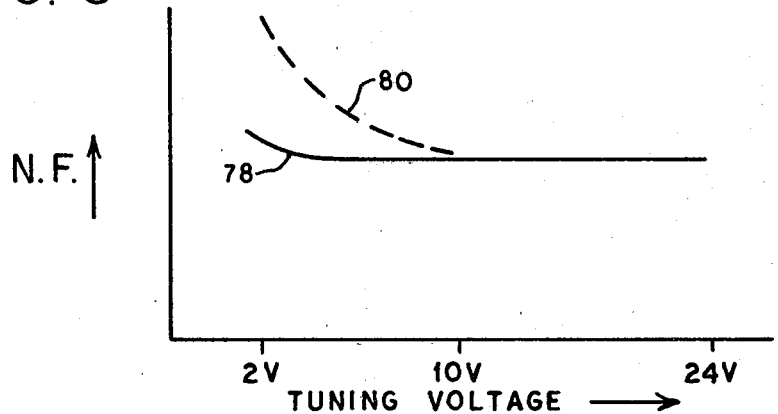
FIG. 7
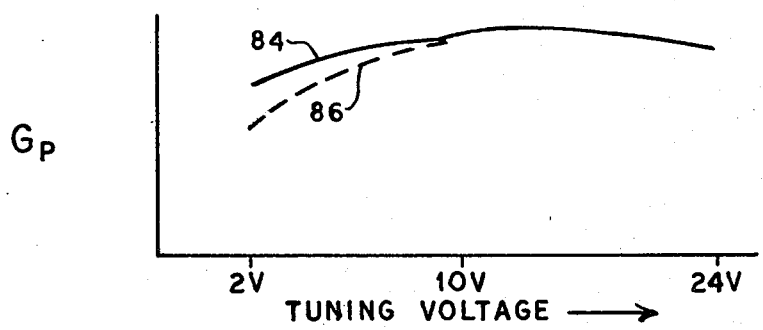
FIG. 8

OSCILLATOR FOR TELEVISION TUNER

BACKGROUND OF THE INVENTION

This invention is generally directed to improvements in television receivers, and particularly to an improved oscillator for use in a television receiver having an electronically tuneable tuner.

Conventional television tuners typically receive a variable DC tuning voltage for altering the characteristics of a varacter diode. As the characteristics of the diode change, the tuner's oscillator oscillates at different frequencies for detecting television signals broadcast over various channels.

A problem with many tuner oscillators is that their output power decreases significantly as they are tuned to frequencies corresponding to lower numbered channels. Consequently, the oscillator injection to the receiver's mixer decreases. This causes the mixer's conversion gain to suffer a corresponding decrease, and also results in a poorer noise figure for the tuner.

Because the power output of conventional tuner oscillators is relatively low at frequencies corresponding to low channel numbers, the mixer is typically a bipolar device capable of operating with low signal injection. However, bipolar mixers normally have poorer cross-modulation characteristics and poorer signal handling capability than is desired. MOSFET type mixers are superior in both respects to bipolar mixers, but they require an oscillator injection signal which is relatively large over the entire band of oscillator frequencies. Hence, MOSFET type mixers are difficult to use with conventional oscillators. These and other problems discussed hereinafter are associated with many conventional electrically tuneable oscillators.

OBJECTS OF THE INVENTION

It is a general object of the invention to provide an improved oscillator for use in an electronically tuneable television tuner.

It is a more specific object of the invention to provide such an oscillator which develops a larger and more constant power output at low frequencies, and which also provides an improved noise figure.

BRIEF DESCRIPTION OF THE FIGURES

The objects stated above and other objects of the invention are set forth more particularly in the following detailed description of the accompanying drawings, in which:

FIG. 3 depicts the operating current versus tuning voltage characteristics of a conventional oscillator and the oscillator shown in FIG. 4;

FIG. 5 illustrates curves which show the current gain bandwidth product versus tuning voltage for a conventional transistor oscillator and for the transistor oscillator of FIG. 4;

FIG. 6 is a plot of current gain bandwidth product versus collector current for a typical bipolar transistor showing the range of $f_t$ in which the transistor oscillator of FIG. 4 operates;

FIG. 7 includes curves which depict the noise figure versus tuning voltage characteristics provided by a conventional oscillator and by the oscillator shown in FIG. 4; and FIG. 8 shows curves which illustrate the conversion gain of a mixer receiving injection from a conventional oscillator and from the oscillator of FIG. 4.

DESCRIPTION OF THE PREFERRED EMBODIMENT

In electronic tuners of the type under consideration, a tuning voltage is normally varied by a user control in order to change channels. As discussed above, that tuning voltage is conventionally used to alter the characteristics of a varacter diode in the tuner's oscillator.

Figure 1:
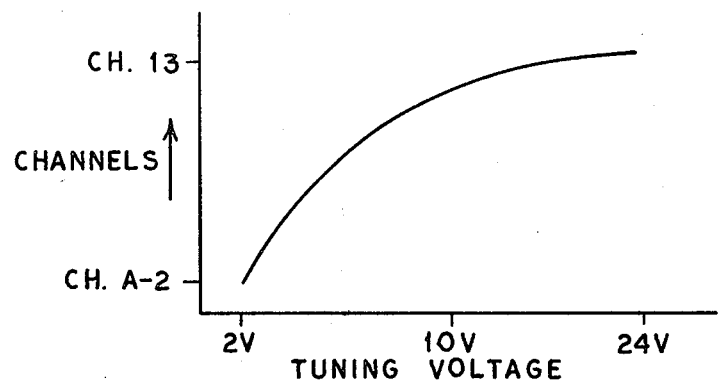
FIG. 1 shows a curve indicating the range of channels over which a typical tuner is tuned in response to various values of a tuning voltage.

The typical variation in tuning voltage required to change the oscillator's frequency between channels A-2 and channel 13 is depicted in FIG. 1. As shown, the tuning voltage varies from about two volts to twenty four volts over this tuning range. The low end of this range, typically between ten volts and two volts, is where conventional oscillators experience a decreased power output. This decrease is due to substantially larger circuit dissipation losses at these low bias voltages, caused by a low quality factor (Q) of the varacter diode normally used with such oscillators. In addition, a significant mismatch frequently exists between the active oscillator circuit and its resonant circuit because of the very large capacitance of the varacter diode.

Figure 2:
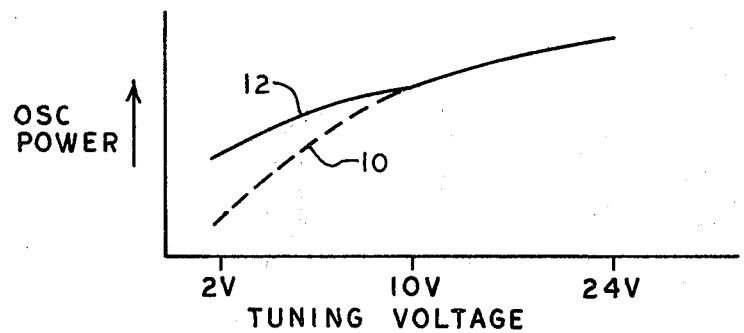
FIG. 2 depicts curves showing the power output versus tuning voltage characteristics of a conventional oscillator and of the improved oscillator shown in FIG. 4.

Referring to FIG. 2, the dashed line 10 illustrates the decreasing output power of a conventional oscillator over the tuning voltage range of about ten volts to two volts. It is this decrease in output power or signal injection which usually prohibits the use of MOSFET type mixers with conventional varacter tuned oscillators. The output power developed at tuning voltages above ten volts is usually sufficient for proper operation of the preferred MOSFET mixer.

As described in more detail below, the power output of the present oscillator is automatically increased at a given value of tuning voltage (ten volts, for example) to provide the power output characteristics shown by the solid curve 12 in FIG. 2. This increase in the oscillator's output power at tuning voltages corresponding to relatively low numbered channels provides a superior noise figure and enables the oscillator to be used with a MOSFET type mixer.

Generally, conventional tuner oscillators include a tuned circuit coupled to a transistor which generates oscillators in the tuned circuit. These oscillations constitute the signal injection to the mixer. Bias on this transistor is maintained at a constant level to sustain a fixed operating current in it. For example, the dashed line 14 in FIG. 3 shows a typical transistor operating current $I_{c1}$ (of four milliamperes, for example) which is held constant over the entire range of tuning voltage. In contrast, the operating current of the transistor in the present oscillator is automatically and gradually increased up to $I_{c2}$ (10 milliamperes, for example) when the tuning voltage decreases below the ten volt level, as shown by the curve 16. This increase in current increases the oscillator's output power, as shown in FIG. 2, to a level sufficient to operate the mixer more efficiently. It also results in a much lower conversion noise which, in turn, provides an improved over-all noise figure, substantially higher conversion gain, and a higher over-all gain for the tuner.

Figure 4:
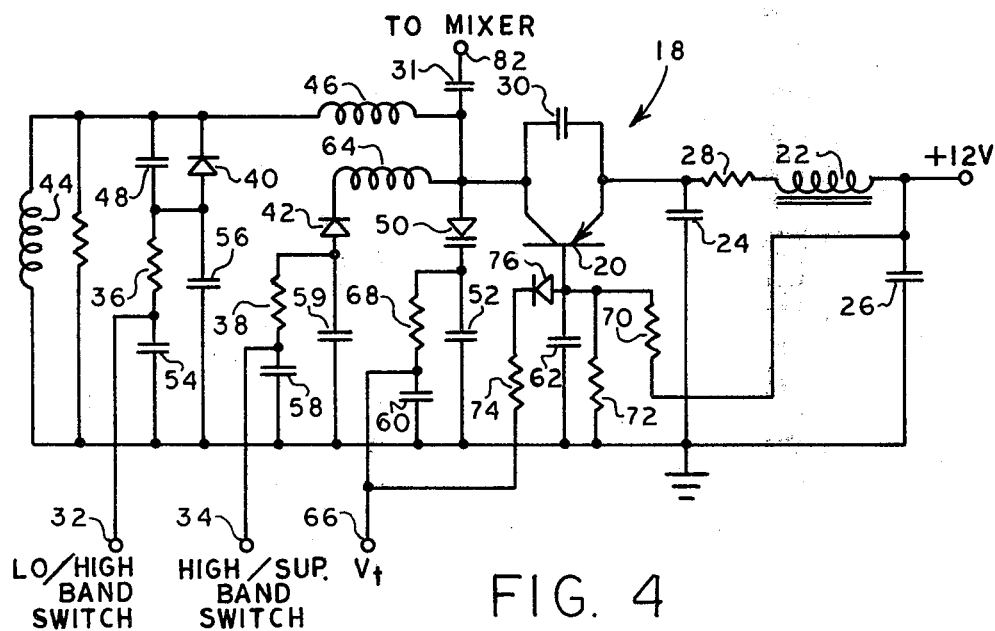
FIG. 4 is a circuit diagram of an oscillator constructed in accordance with the invention.

Referring now to FIG. 4, an oscillator 18 constructed according to the invention is shown as including a transistor 20. It is this transistor whose operating current is changed to provide an increase in the oscillator's output power.

Coupled to the emitter of the transistor 20 is a d.c. bias network comprising an R.F. choke 22, a bypass capacitor 26 and a resistor 28. The value of resistor 28 is chosen to dampen any spurious resonance in the choke 22 and to supply d.c. degeneration so as to provide d.c. stability in the oscillator. A feedback circuit comprising capacitors 24 and 30 is coupled to the emitter of transistor 20 to provide satisfactory oscillation over the desired frequency band. The oscillator signal is coupled to the mixer via a capacitor 31.

The collector circuit of transistor 20 includes a conventional circuit adapted to tune the oscillator to a low band of frequencies, a high band of frequencies, and a super band of frequencies. These frequency bands are selected by d.c. voltages which are applied to terminals 32 and 34 from any conventional source in the receiver's tuner.

To select the low band of oscillation frequencies, the voltages at terminals 32 and 34 are held low. These low voltages are coupled via resistors 36 and 38 to diodes 40 and 42, respectively, to turn both diodes off. In this conditon, the oscillator is tuned by coils 44 and 46, a capacitor 48, and the series combination of a varacter diode 50 and a capacitor 52. Capacitors 54, 56, 58, 59, 60 and 62 are merely bypass capacitors.

The super band of frequencies is selected by imposing high level voltages on terminals 32 and 34. In this condition, the diodes 40 and 42 are both turned on. Consequently, the coil 44 and the capacitor 48 are shunted by the diode 40 and no longer affect tuning. In addition, the on condition of diode 42 causes the coil 46 to be in parallel with another coil 64, and this combination to be tuned with the capacitance formed by the varacter 50 and the capacitor 52.

To select the high frequency band, a high level voltage is applied to the terminal 32 while a low level voltage is applied to terminal 34. This condition causes the diode 40 to be turned on and the diode 42 to be turned off. The components which now select the tuning range are the same as those for the super band except that the coil 64 is placed in an inoperative mode.

In any of the three frequency bands, a particular frequency is selected by the application of a tuning voltage $V_t$ to a terminal 66. That voltage is coupled via a resistor 68 to the varacter 50 to alter its capacitance and thereby tune the oscillator to a frequency corresponding to a selected channel.

Variation of the level of operating current in the transistor 20 is effected by a circuit which includes resistors 70, 72 and 74 and a diode 76. The resistors 70 and 72 are coupled between ground and a supply voltage to form a voltage divider which biases the transistor 20 so that a predetermined level of operating current is established in this transistor. For example, the resistors 70 and 72 may be selected to provide an operating current of four milliamperes in the transistor 20.

To modify the current in transistor 20, its base is coupled via the resistor 74 and the diode 76 to the tuning voltage which is impressed on terminal 66. Thus, when the tuning voltage exceeds the bias provided by resistors 70 and 72, the diode 76 is reverse biased and the current level of four milliamperes in transistor 20 is maintained. However, when the tuning voltage decreases to the point where it is less positive than the biasing voltage at the base of transistor 20, the diode 76 conducts and lowers the bias on transistor 70. Consequently, its operating current increases. Further decreases in the value of the tuning voltage cause corresponding increases in the value of the operating current in transistor 20.

Preferably, the resistors 70, 72 and 74 are selected such that the diode 76 conducts when the tuning voltage decreases to about ten volts in this embodiment. Consequently, the operating current in transistor 20 increases as shown by curve 16 in FIG. 3. That is, for relatively low numbered channels corresponding to tuning voltages between about two volts and ten volts, the operating current increases from about four milliamperes to more than ten milliamperes. For higher numbered channels, (between tuning voltages of ten volts and twenty four volts) the operating current is held substantially constant by the resistors 70 and 72.

One of the results of increasing the operating current of transistor 20 is depicted graphically in FIGS. 5 and 6. As operating current increases from $I_{c1}$ to $I_{c2}$, the current gain bandwidth ($f_t$) of a typical tuner oscillator transistor increases from $f_{t1}$ (typically about 1200 megahertz) to $f_{t2}$ (typically about 1370 megahertz). In addition, the tuner's over-all noise figure is improved as shown in FIG. 7 where the curve 80 illustrates the noise figure (N.F.) for a tuner whose oscillator transistor has a constant operating current, and the curve 78 illustrates the noise figure for a tuner using the oscillator shown in FIG. 4.

Because of its increased power output at low numbered channels, the oscillator injection to the mixer (at terminal 82 in FIG. 4) undergoes a smaller variation. Consequently, the mixer realizes a more uniform conversion gain ($G_p$) as indicated by the solid curve 84 in FIG. 8. The curve 86 illustrates the conversion gain of a mixer driven by an oscillator whose power output declines as shown by the curve 10 of FIG. 2.

From the foregoing description, it will be appreciated that the improved oscillator is much more suitable than conventional oscillators for driving an MOSFET type mixer. This combination provides better large signal handling capability to achieve improved cross-modulation and inter-modulation characteristics while maintaining satisfactory over-all low noise figure over a wide frequency band.

Although the present oscillator has been described in terms of a preferred embodiment, it will be obvious to those skilled in the art that many alterations and modifications may be made without departing from the invention. Accordingly, it is intended that all such alterations and modifications be considered as within the spirit and scope of the invention as defined by the appended claims.

What is claimed is:

1. In a television receiver having a tuner which is tunable in response to a tuning voltage and in which an oscillator provides signal injection to a mixer, an improved oscillator, comprising:

a tuning network continuously tunable in response to said tuning voltage;

transistor means coupled to the tuning network for establishing oscillations therein;

a biasing network for establishing a given operating current in said transistor means; and circuit means coupled to the biasing network and responsive to the tuning voltage for changing the operating current in said transistor means so as to increase the oscillator's signal injection level to the mixer at values of tuning voltage which correspond to relatively low channel numbers.

2. An oscillator as set forth in claim 1 wherein said circuit means is adapted to hold the operating current at a substantially constant level at values of the tuning voltage corresponding to relatively high channel numbers, and to begin increasing the operating current as the tuning voltage reaches a given value corresponding to a relatively lower channel number.

3. An oscillator as set forth in claim 2 wherein said circuit means includes a diode coupled to the biasing network and responsive to said given value of the tuning voltage for conducting so as to increase the operating current in said transistor means.

4. An oscillator as set forth in claim 3 wherein said biasing network includes a relative voltage divider providing bias for the transistor means, and wherein said diode is coupled to the voltage divider so as to alter the bias in response to the tuning voltage reaching said given value.

5. In a television receiver having a tuner which is tunable in response to a variable tuning voltage and in which an oscillator provides signal injection to a mixer, an improved oscillator, comprising:
  a tuning network continuously tunable in response to said tuning voltage;
  a transistor coupled to the tuning network for establishing oscillations therein;
  a resistive voltage divider coupled to the base of said transistor for establishing an operating bias voltage thereon and a corresponding current in the collector; and
  a diode circuit receiving the tuning voltage and being coupled to the voltage divider so as to alter the bias voltage on said transistor and thereby increase the transistor's collector current and signal injection level to the mixer in response to the tuning voltage reaching a predetermined value representative of a relatively low channel number.

* * * * *